(12) United States Patent
Ashar et al.

(10) Patent No.: US 6,415,430 B1
(45) Date of Patent: Jul. 2, 2002

(54) METHOD AND APPARATUS FOR SAT SOLVER ARCHITECTURE WITH VERY LOW SYNTHESIS AND LAYOUT OVERHEAD

(75) Inventors: Pranav Ashar, Princeton, NJ (US); Peixin Zhong, Emmaus, PA (US); Margaret Martonosi, Princeton, NJ (US)

(73) Assignee: NEC USA, Inc., Princeton, NJ (US)

( * ) Notice: Subject to any disclaimer, the term of this patent is extended or adjusted under 35 U.S.C. 154(b) by 0 days.

(21) Appl. No.: 09/456,506

(22) Filed: Dec. 8, 1999

Related U.S. Application Data

(60) Provisional application No. 60/141,831, filed on Jul. 1, 1999.

(51) Int. Cl.[7] .............................................. G06F 17/50
(52) U.S. Cl. ................................ 716/18; 716/7; 716/5; 703/15
(58) Field of Search ........................... 716/1–21; 703/2, 703/14–16

(56) References Cited

U.S. PATENT DOCUMENTS

| 5,088,048 A | | 2/1992 | Dixon et al. ................... 706/51 |
|---|---|---|---|
| 5,276,897 A | | 1/1994 | Stalmarck ................... 709/105 |
| 5,331,570 A | | 7/1994 | Bershteyn ....................... 716/4 |
| 5,377,201 A | | 12/1994 | Chakradhar et al. ......... 714/741 |
| 5,461,573 A | | 10/1995 | Chakradhar et al. ........... 716/4 |
| 5,469,367 A | | 11/1995 | Puri et al. ...................... 716/18 |
| 5,481,717 A | | 1/1996 | Gaboury ........................ 717/4 |
| 5,657,240 A | | 8/1997 | Chakradhar et al. ........... 716/4 |
| 5,748,487 A | | 5/1998 | Sawasaki et al. ............... 716/1 |
| 5,831,996 A | | 11/1998 | Abramovici et al. ........ 714/738 |
| 5,910,958 A | | 6/1999 | Jay et al. ..................... 714/738 |
| 6,026,222 A | * | 2/2000 | Gupta et al. ................... 716/5 |
| 6,038,392 A | * | 3/2000 | Ashar et al. ................... 703/27 |
| 6,086,626 A | * | 7/2000 | Jain et al. ....................... 716/5 |
| 6,131,078 A | * | 10/2000 | Plaisted ......................... 703/2 |
| 6,292,916 B1 | * | 9/2001 | Abramovici et al. ......... 714/736 |
| 6,301,687 B1 | * | 10/2001 | Jain et al. ....................... 716/3 |
| 6,308,299 B1 | * | 10/2001 | Burch et al. ................... 716/4 |

OTHER PUBLICATIONS

Rashid et al. ("Dynamic circuit generation for solving specific problem instances of Boolean satisfiability", Proceedings of IEEE Symposium on FPGAs for Custom Computing Machines, Apr. 15, 1998, pp. 196–204).*

Zhong et al. ("Using reconfigurable computing techniques to accelerate problems in the CAD domain: a case study with Boolean satisfiability", Proceedings of Design Automation Conference, Jun. 15, 1998, pp. 194–199).*

Wood et al. ("FPGA routing and routability estimation via Boolean Satisfiability", IEEE Transactions on Very Large Scale Integration (VLSI) Systems, vol. 6, No. 2, Jun. 1998, pp. 222–231).*

(List continued on next page.)

Primary Examiner—Matthew S Smith
Assistant Examiner—Phallaka Kik
(74) Attorney, Agent, or Firm—Sughrue Mion, PLLC

(57) ABSTRACT

A method and apparatus for implementing communication between literals and clauses of a Boolean SAT problem through use of a time-multiplexed pipelined bus architecture rather than hardwiring it using on-FPGA routing resources. This technique allows the circuits for different instances of the Boolean SAT problem to be identical except for small local differences. Incremental synthesis and place-and-route effort required for each instance of the Boolean SAT problem becomes negligible compared to the time to actually solve the SAT problem. The time-multiplexing feature allows dynamic addition of clauses into the SAT solver algorithm. The pipeline architecture is highly pipelined with very few long wires and no wires crossing FPGA boundaries, thereby providing high clock speeds.

24 Claims, 12 Drawing Sheets

OTHER PUBLICATIONS

Zhong et al. ("Using configurable computing to accelerate Boolean satisfiability", IEEE Transactions on Computer–Aided Design of Integrated Circuits and Systems, vol. 18, No. 6, pp. 861–868).*

NN740666 ("Iterative Common Truth Set Detection Mechanism for Boolean Function Satisfiabilty Recognition", IBM Technical Disclosure Bulletin, vol. 17, No. 1, Jun. 1974, pp. 66–69 (5 pages).*

M. Abramovici and D. Saab, Satisfiability on Reconfigurable Hardware, Seventh International Workshop on Field Programmable Logic and Applications (1997), Jan. 1997.

J. Arnold, D. Buell and E. Davis, Splash 2 (Attached Processor Board), Fourth Annual ACM Symposium on Parallel Algorithms and Architectures, pp. 316–322 (1992), Jan. 1992.

J. Baab, R. Tessier and A. Agarwal, Overcoming Pin Limitations In FPGA–Based Logic Emulators, IEEE Workshop on FPGA–based Custom Computing Machines, pp. 142–151 (1993), Jan. 1993.

J. Burch and V. Singhal, Tight Integration Of Combinational Verification Methods, Proceedings of ICCAD, pp. 570–576 (1998), Jan. 1998.

S. Chakradhar, V. Agrawal and Rothweiler, A Transitive Closure Algorithm For Test Generation, IEEE Transactions on Computer–Aided Design of Integrated Circuits and Systems, vol. 12, No. 7, pp. 1015–1028 (Jul. 1993).

M. Davis and H. Putnam, A Computing Procedure for Quantification Theory, Journal of the ACM, vol. 7, pp. 201–215 (1960), Jan. 1960.

P. Goel, An Implicit Enumeration Algorithm to Generate Tests For Combinational Logic Circuits, IEEE Transactions on Computers, vol. C30, No. 3, pp. 337–343 (Mar. 1981).

A. Gupta and P. Ashar, Integrating A Boolean Satisfiability Checker And BDDs For Combinational Equivalence Checking, Proceedings of VLSI Design 97, pp. 222–225, Jan. 1997.

T. Larrabee, Test Pattern Generation Using Boolean Satisfiability, IEEE Transactions on Computer–Aided Design, vol. 11, No. 1, pp. 4–15, (Jan. 1992).

J. Silva and K. Sakallah, GRASP–A New Search Algorithm For Satisfiability, Proceedings of ICCAD, pp. 220–227 (1996), Jan. 1996.

P. Stephan, R. Brayton and A. Sangiovanni–Vincentelli, Combinational Test Generation Using Satisfiability, EEE Transactions on Integrated Circuits and Systems, vol. 15, No. 9, pp. 1167–1176 (Sep. 1996).

T. Suyama, M. Yokoo and H. Sawada, Solving Satisfiability Problems on FPGAs, Sixth International Workshop on Field Programmable Logic and Applications (1996), Jan. 1996.

* cited by examiner

```
Initialize all variables to "free" value;
do {
    compute implications and check contradiction;
        if (contradiction)
        {
            if (active_variable->assigned_value == 1)
                active_variable->assigned_value = 0;
            else
                backtrack();
            endif;
        }
        else
        {
            active_variable = next_free_variable();
            active_variable->assigned_value = 1;
        }
        endif;
    while()
}
```

*FIG. 1*
*PRIOR ART*

METHOD AND APPARATUS FOR SAT SOLVER ARCHITECTURE WITH VERY LOW SYNTHESIS AND LAYOUT OVERHEAD

CROSS-REFERENCES TO RELATED APPLICATIONS

This application is an application filed under 35 U.S.C. §111(a), claiming benefit pursuant to 35 U.S.C. §§119–120 of the filing date of the Provisional Application Serial No. 60/141,831 filed on Jul. 1, 1999, pursuant to 35 U.S.C. §111(b). The Provisional Application Serial No. 60/141,831 is incorporated herein by reference for all it discloses.

TECHNICAL FIELD OF THE INVENTION

This invention is related to determining if conflicting signals exist in a Boolean algorithm that represents a group of signals. More specifically, the invention is a method and apparatus for performing Boolean satisfiability testing on a Boolean algorithm using an apparatus that incorporates reconfigurable hardware in a pipelined architecture. The clauses of the Boolean algorithm are input into the reconfigurable hardware and implication and conflict analysis is performed of the variables constituting the Boolean algorithm. The invention also performs non-chronological backtracking on the variables if conflicts are uncovered. The invention is embodied in various methods, apparatuses, a hardware architecture, a computer system, and a computer program product that performs satisfiability testing on a Boolean algorithm.

BACKGROUND

The following references provide useful background information on the indicated topics, all of which relate to the invention, and are incorporated herein by reference.
Challenge Benchmarks:
   DIMACS, *DIMACS Challenge Benchmarks and UCSC Benchmarks*, available at ftp://dimacs.rutgers.edu/pub/challenge/sat/benchmarks/cnf.
Use of reconfigurable hardware for satisfiability testing:
   M. Abramovici and D. Saab, *Satisfiability on Reconfigurable Hardware*, Seventh International Workshop on Field Programmable Logic and Applications (1997).
Systolic processing systems:
   J. Arnold, D. Buell and E. Davis, *Splash 2 (Attached Processor Board)*, Fourth Annual ACM Symposium on Parallel Algorithms and Architectures, pp. 316–322 (1992).
Virtual wiring between FPGAs:
   J. Baab, R. Tessier and A. Agarwal, *Overcoming Pin Limitations In FPGA-Based Logic Emulators*, IEEE Workshop on FPGA-based Custom Computing Machines, pp. 142–151 (1993).
Combinational verification for equivalence checking:
   J. Burch and V. Singhal, *Tight Integration Of Combinational Verification Methods*, Proceedings of ICCAD, pp. 570–576 (1998).
Test generation algorithm using transitive closure computation and decision making:
   S. Chakradhar, V. Agrawal and S. Rothweiler, *A Transitive Closure Algorithm For Test Generation*, IEEE Transactions on Computer-Aided Design of Integrated Circuits and Systems, Vol. 12, No. 7, pp. 1015–28 (July 1993).
Uniform proof procedure for quantification theory:
   M. Davis and H. Putnam, *A Computing Procedure for Quantification Theory*, Journal of the ACM, Vol. 7, pp. 201–215 (1960).
Path-Oriented Decision Making (PODEM) for combinational logic circuits:
   P. Goel, *An Implicit Enumeration Algorithm To Generate Tests For Combinational Logic Circuits*, IEEE Transactions on Computers, Vol. C30, No. 3, pp. 337–343 (March 1981).
Reduction of problem size and backtrack requirements using binary decision diagrams coupled with a Boolean satisfiability checker:
   A. Gupta and P. Ashar, *Integrating A Boolean Satisfiability Checker And BDDs For Combinational Verification*, Proceedings of VLSI Design 98, pp. 222–225 (1998).
Using the Boolean satisfiability method for generating test patterns for single stack-at faults in combinational circuits:
   T. Larrabee, *Test Pattern Generation Using Boolean Satisfiability*, IEEE Transactions on Computer-Aided Design, Vol. 11, No. 1, pp. 4–15, (January 1992).
Augmentation of basic backtracking with conflict analysis:
   J. Silva and K. Sakallah, *GRASP-A New Search Algorithm For Satisfiability*, Proceedings of ICCAD, pp. 220–227 (1996).
Using reduction to satisfiability for combinational logic test generation:
   P. Stephan, R. Brayton and A. Sangiovanni-Vincentelli, *Combinational Test Generation Using Satisfiability*, IEEE Transactions on Integrated Circuits and Systems, Vol. 15, No. 9, pp. 1167–76 (September 1996).
Solving satisfiability problems using a specialized circuit to solve each problem instance on a FPGA:
   T. Suyama, M. Yokoo and H. Sawada, *Solving Satisfiability Problems on FPGAs*, Sixth International Workshop on Field Programmable Logic and Applications (1996).

There will now be provided a discussion of various topics to provide a proper foundation for understanding the invention.

As illustrated by the literature, Boolean Satisfiability Checking (SAT) is at the core of many applications in computer-aided design (CAD) of very large scale integrated (VLSI) circuits. A number of techniques for accelerating SAT using FPGA-based (Field Programmable Gate Arrays) instance-specific reconfigurable hardware have been proposed in the literature. While significant speedups have been reported over software implementations of SAT for a number of examples, fundamental hurdles remain before this technology can be applied widely.

The first fundamental hurdle is the time overhead for compiling the hardware implementation of the algorithm on to FPGAs. This includes the times for mapping the logic netlist onto the Combinational Logic Blocks (CLB) of the FPGA and the time for place-and-route. In most cases, this combined time can actually be comparable to or greater than the time to actually solve the formula, even in software.

The second fundamental hurdle is that the level of sophistication in the hardware algorithm is not equal to the level of the best software algorithm. The hardware algorithm basically relies on raw parallelism to achieve the speedup. As a result, it is possible to find a number of examples for which the software implementation is faster or comparable because the software heuristics work very well. In previous hardware acceleration efforts for SAT, non-chronological backtracking has been incorporated into the hardware SAT algorithm. Another major feature that often speeds up the SAT solver considerably is the addition of clauses corresponding to solution subspaces that do not need to be explored. This feature is practically impossible to implement in previous architectures.

Another fundamental drawback is that previous architectures have led to much slower clock speeds than what is potentially achievable in FPGAs. The slow clock speeds are a result of the hardwired implementation of connections between literals leading to irregular layout, long wires and wires crossing FPGA boundaries.

The Boolean satisfiability problem is a well-known constraint satisfaction problem with many applications in computer-aided design, such as test generation, logic verification and timing analysis. Given a Boolean formula, the objective is either to find an assignment of 0–1 values to the variables so that the formula evaluates to true, or to establish that such an assignment does not exist.

The Boolean formula is typically expressed in conjunctive normal form (CNF), also called product-of-sums form. Each sum term (clause) in the CNF is a sum of single literals, where a literal is a variable or its negation. An n-clause is a clause with n literals. For example, $v_i+v'_j+v_k$ is referred to as a 3-clause. In order for the entire formula to evaluate to 1, each clause must be satisfied, i.e., evaluate to 1.

Most current SAT solvers are based on the Davis-Putnam algorithm. Referring to FIG. 1, pseudo code for the basic Davis-Putnam algorithm is shown. Referring to FIG. 2, the process flow for the basic Davis-Putnam algorithm is illustrated.

The basic algorithm begins from an empty partial assignment, as shown in Step S100. At Step S110, the algorithm determines if there are any free variables available. The algorithm proceeds by assigning a 0 or 1 value to one free variable at a time. After each assignment, at Step S120, the algorithm determines the direct and transitive implications of that assignment on other variables. In Step S130, the algorithm checks contradictions. At Step S140, if no contradictions are detected during the implication procedure, the algorithm picks the next free variable at Step S150, and repeats the procedure. Otherwise, the algorithm attempts a new partial assignment by complementing the most recently assigned variable for which only one value has been tried so far, as shown in Steps S160–S180. This step is called backtracking. The algorithm terminates when no free variables are available and no contradictions have been encountered (implying that all the clauses have been satisfied and a solution has been found), or when all possible assignments have been exhausted. The algorithm is complete in that it will find a solution if it exists.

Determining implications is crucial to pruning the search space since (1) it allows the algorithm to skip entire regions of the search space corresponding to contradictory partial assignments, and (2) every implied variable corresponds to one less free variable on which search must be performed. Unfortunately, detecting implications in software is very slow since each clause containing the newly assigned or implied variable is scanned and updated sequentially, with the process repeated until no new implications are detected.

The potential for hardware speedup potential in the SAT algorithm stems from recognizing that the implication procedure central to the algorithm is both highly parallelizable and easily mapped to basic logic gates.

Recent literature in the field discusses software implementations of the Davis-Putnam algorithm that have enhanced the algorithm in various ways while maintaining the same basic flow. The contribution of the GRASP work is notable since it applies non-chronological backtracking (conflict analysis) and dynamic clause addition to prune the search space further.

Conflict analysis and clause addition are relative easy to implement in software. When a new value is implied, it is added to a data structure recording the implication graph. When a conflict occurs, traversing the graph backwards identifies predecessors of the conflict. It is also easy to add new clauses to the clause database. Such techniques may greatly improve the performance on many problems.

Much of the performance improvement reported by GRASP comes from its implementation of conflict analysis. When the basic Davis-Putnam algorithm observes a conflict, it backtracks to change the partial assignment. It does not, however, analyze which variable is the true reason for the observed conflict. The backtracking process may complement variables irrelevant to the conflict and repeatedly explore related dead ends. More sophisticated conflict analysis works to identify the variable assignments that lead to the conflict. Acting as a reverse implication procedure, conflict analysis identifies the transitive predecessors of the implied literals leading to the conflict.

Consider, for example, the Boolean formula composed of the following 3-clauses in Equation (1):

$$(v_1'+v_8+v_9)(v_2'+v_8+v_9') \ (v'_1+v_8'+v_{10}) \ (v_3'+v_8'+v_{10}') \quad \text{Equation (1)}$$

If $v_1, v_2 \ldots v_7$ are previously assigned to 1 and then $v_8$ is assigned to 1, the resulting implication graph is shown in FIG. 3A. A conflict is detected on $v_{10}$. The predecessors for the conflict are $v_1$, $v_3$ and $v_8$. Similarly, when $v_8$ is changed to 0 (see FIG. 3B), it generates a conflict in $v_9$. The causes of the conflict are $v_1$, $v_2$ and $v_8'$. At this point, we know that either value of $v_8$ will lead to a conflict. The basic algorithm would change the value of $v_7$ to 0 and try again. However, $v_1$, $v_2$ and $v_3$ are actually responsible for the conflicts. Therefore, we can directly backtrack to the most recently assigned variable causing the dual conflict, i.e., $v_3$. This is called non-chronological backtrack.

In general, when we first meet a conflict on branch variable $v_k$, we can identify the predecessor set as $P(v_k)$. Then if we have a conflict for $v_k'$, we can get another predecessor set $P(v_k')$. The union of the two sets, excluding $v_k$ and $v_k'$, is the predecessor that leads to the double conflict in $v_k$. We can backtrack to the variables in this set.

In the previous example, conflict analysis reveals that if $v_1$, $V_2$ and $v_3$ are all 1, the formula can not be satisfied. This is a hidden constraint not directly manifested as a clause. We can add a new clause $(v_1'+v_2'+v_3')$ to the Boolean formula being solved. Adding this clause to the formula allows the solver to detect this conflict earlier and avoid exploring the same space in the future search.

Conflict analysis and clause addition are relative easy to implement in software. When a new value is implied, it is added to a data structure recording the implication graph. When a conflict occurs, traversing the implication graph backwards identifies predecessors of the conflict. It is also easy to add new clauses to the clause database. Such techniques may greatly improve the performance on many problems.

The literature includes several proposals for solving SAT using reconfigurable hardware. Suyama, et al. propose their own SAT algorithm distinct from the Davis-Putnam approach. Their approach is characterized by the fact that at any point, a full (not partial) variable assignment is evaluated. While Suyama, et al. propose heuristics to prune the search space, they acknowledge that the number of states visited in their approach can be up to eight times the number of states visited in the basic Davis-Putnam approach.

The work by Abramovici and Saab also proposed a configurable hardware SAT solver. Their approach basically amounts to an implementation of a PODEM-based (Path-Oriented DEcision Making) algorithm in reconfigurable hardware. PODEM is typically used to solve test generation problems. Unlike PODEM, which relies on controlling and observing the primary inputs and outputs of a circuit, the Davis-Putnam algorithm also captures relationships between the internal variables in the circuit; this significantly reduces the state space visited and the run time.

In addition, previous hardware SAT solvers described in the literature do not employ dynamic clause addition. Importantly, all the previous approaches generate formula-specific solver circuits that differ significantly from formula to formula. As a result, the entire circuit for each formula must be completely synthesized, placed and routed and downloaded to the multiple FPGAs from scratch—a significant run time overhead.

SUMMARY OF INVENTION

The invention has been made in view of the above circumstances and has an object to overcome the above problems and limitations of the prior art, and has a further object to provide the capability to for solving Boolean SAT formulas.

Additional objects and advantages of the invention will be set forth in part in the description that follows and in part will be obvious from the description, or may be learned by practice of the invention. The objects and advantages of the invention may be realized and attained by means of the instrumentalities and combinations particularly pointed out in the appended claims.

It is a further object of the invention to provide a method, a computer system and a computer program product for solving a Boolean SAT formula.

It is yet a further object of the invention to provide a method, a computer system and a computer program product for creating a Boolean SAT solver for solving a Boolean SAT formula.

It is still a further object of the invention to provide a method and an apparatus for downloading and partitioning a Boolean SAT formula and loading the partitions into processing elements for solving the SAT formula.

The above and other objects of the invention are accomplished by providing an apparatus the uses a ring topology pipeline bus between the processing elements and the control device to pass variables from a Boolean SAT formula for processing.

The above and further objects of the invention are further accomplished by providing a method and an apparatus that dynamically adds redundant clauses to a Boolean SAT formula to uncover hidden constraints.

The above objects are further achieved by providing a method for computing implications and conflicts between the variables in a Boolean SAT formula and executing non-chronological backtracking to resolve the conflicts that are found.

Preferably, the above objects are achieved by providing a method of creating a Boolean SAT solver apparatus for solving a Boolean SAT formula, wherein the Boolean SAT solver includes a plurality of reconfigurable hardware modules, the method including reading the Boolean SAT formula, partitioning the Boolean SAT formula and limiting each partition to a predetermined number of variables, configuring the plurality of reconfigurable modules to form circuit arrays, assigning the partitions of the Boolean SAT formula to the circuit arrays in each of the plurality of reconfigurable hardware modules, and programming the functions and connections specific to each partition of the Boolean SAT formula within each of the plurality of reconfigurable hardware modules.

Preferably, the above objects are further achieved by providing a method for solving a Boolean SAT formula containing a plurality of Boolean variables using a Boolean SAT solver comprised of a plurality of reconfigurable hardware modules, the method including the steps of setting the plurality of Boolean variables to a known state, selecting a free variable from the plurality of Boolean variables and assigning a known value to the selected free variable or indicating that all the variables have been assigned and the Boolean SAT formula solved, dependent upon the outcome of selecting a free variable, assigning a predetermined value to the free variable, computing the logical implication of the assignment to the free variable and either performing conflict analysis on the free variable or selecting another free variable from the plurality of Boolean variables dependent upon the outcome of the logical implication, performing conflict analysis on any conflicts that arise from the logical implication of the free variable, and determining whether to backtrack through the predecessor variables that obtained their value from the assigned free variable and backtracking through the predecessor variables and restarting the logical implication or indicating that the Boolean SAT formula is unsolvable, dependent upon the outcome of the backtrack determination.

Preferably, the above objects are further achieved by providing a computer system adapted to solving a Boolean SAT formula containing a plurality of Boolean variables, including a processor and a memory including software instructions adapted to enable the computer system to perform the steps of setting the plurality of Boolean variables to a known state, selecting a free variable from the plurality of Boolean variables and assigning a known value to the selected free variable or indicating that all the variables have been assigned and the Boolean SAT formula solved, dependent upon the outcome of selecting a free variable, assigning a predetermined value to the free variable, computing the logical implication of the assignment to the free variable and either performing conflict analysis on the free variable or selecting another free variable from the plurality of Boolean variables dependent upon the outcome of the logical implication, performing conflict analysis on any conflicts that arise from the logical implication of the free variable, and determining whether to backtrack through the predecessor variables that obtained their value from the assigned free variable and backtracking through the predecessor variables and restarting the logical implication or indicating that the Boolean SAT formula is unsolvable, dependent upon the outcome of the backtrack determination.

Preferably, the above objects are further achieved by providing a computer program product for enabling a computer to solve a Boolean SAT formula containing a plurality of Boolean variables, the computer program product including software instructions for enabling the computer to perform predetermined operations, and a computer readable medium bearing the software instructions, the predetermined operations including the steps of setting the plurality of Boolean variables to a known state, selecting a free variable from the plurality of Boolean variables and assigning a known value to the selected free variable or indicating that all the variables have been assigned and the Boolean SAT formula solved, dependent upon the outcome of selecting a free variable, assigning a predetermined value to the free variable, computing the logical implication of the assignment to the free variable and either performing conflict analysis on the free variable or selecting another free variable from the plurality of Boolean variables dependent upon the outcome of the logical implication, performing conflict analysis on any conflicts that arise from the logical implication of the free variable, and determining whether to backtrack through the predecessor variables that obtained their value from the assigned free variable and backtracking through the predecessor variables and restarting the logical implication or indicating that the Boolean SAT formula is unsolvable, dependent upon the outcome of the backtrack determination.

Preferably, the above objects are further achieved by providing a method of solving a Boolean SAT formula containing a plurality of Boolean variables using a solver apparatus, wherein the solver apparatus includes a plurality of processing elements, a control device, a pipeline bus interconnecting the plurality of processing elements and the control device in a ring, and a host computer interconnected to the control device, the method including downloading the Boolean SAT formula to the control device, partitioning the Boolean SAT formula and loading the portions into the plurality of processing elements, initializing the plurality of variables of the Boolean SAT formula to a known value, attempting to select a free variable from the plurality of Boolean variables and either assigning the free variable a known value or indicating that the Boolean SAT formula is solved, dependent upon the attempt to assign a known value to a free variable, computing the logical implication of the assignment to the free variable and either performing conflict analysis on the free variable or selecting another free variable from the plurality of Boolean variables for assignment, dependent upon the outcome of the logical implication, performing conflict analysis on any conflicts that arise from the logical implication of the free variable, and determining whether to backtrack through the predecessor variables that obtained their value from the assigned free variable and backtracking through the predecessor variables and restarting the logical implication or indicating that the Boolean SAT formula is unsolvable, dependent upon the outcome of the backtrack determination.

Preferably, the above objects are further achieved by providing an apparatus for downloading a Boolean SAT solver algorithm and formula, and solving the corresponding Boolean SAT problem, the architecture comprising at least one clause module for implementing the Boolean SAT solver algorithm, a control device for receiving the Boolean SAT solver algorithm and formula and distributing the Boolean SAT solver algorithm and formula to the at least one clause module, a pipeline bus interconnecting the control device and the at least one clause module in a ring topology, thereby allowing the Boolean SAT solver algorithm, formula and variable values to be passed between the control device and the at least one clause module, and between clause modules, and a host computer for downloading the Boolean SAT solver algorithm and formula to the control device and receiving results therefrom.

BRIEF DESCRIPTION OF DRAWINGS

The accompanying drawings, which are incorporated in and constitute a part of this specification illustrate embodiments of the invention and, together with the description, serve to explain the objects, advantages and principles of the invention. In the drawings, FIG. 1 is a pseudo code listing for the basic Davis-Putnam algorithm;

DETAILED DESCRIPTION OF THE INVENTION

Figure 2:
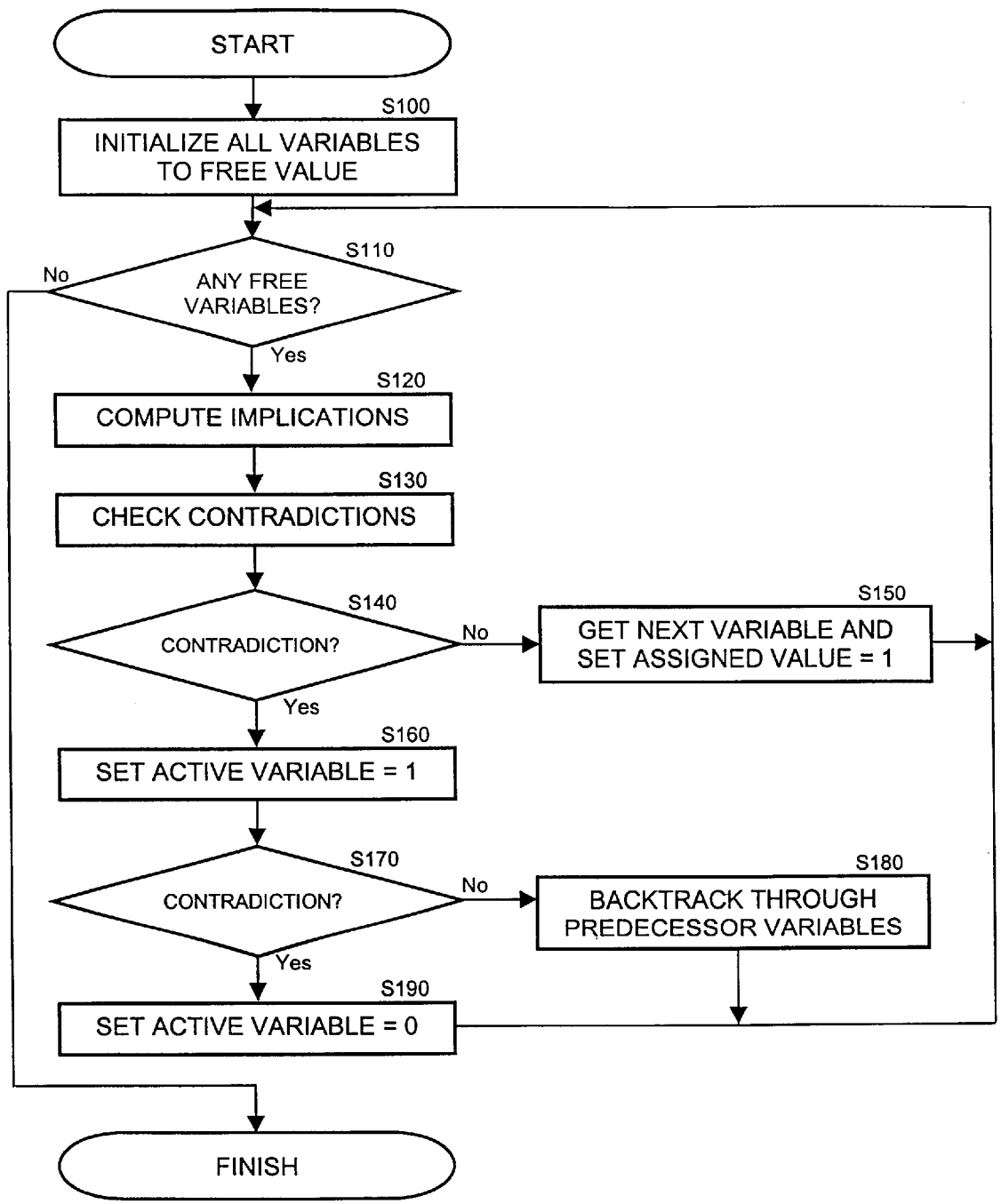
FIG. 2 depicts the process flow for the basic Davis-Putnam algorithm.
Figure 3A:
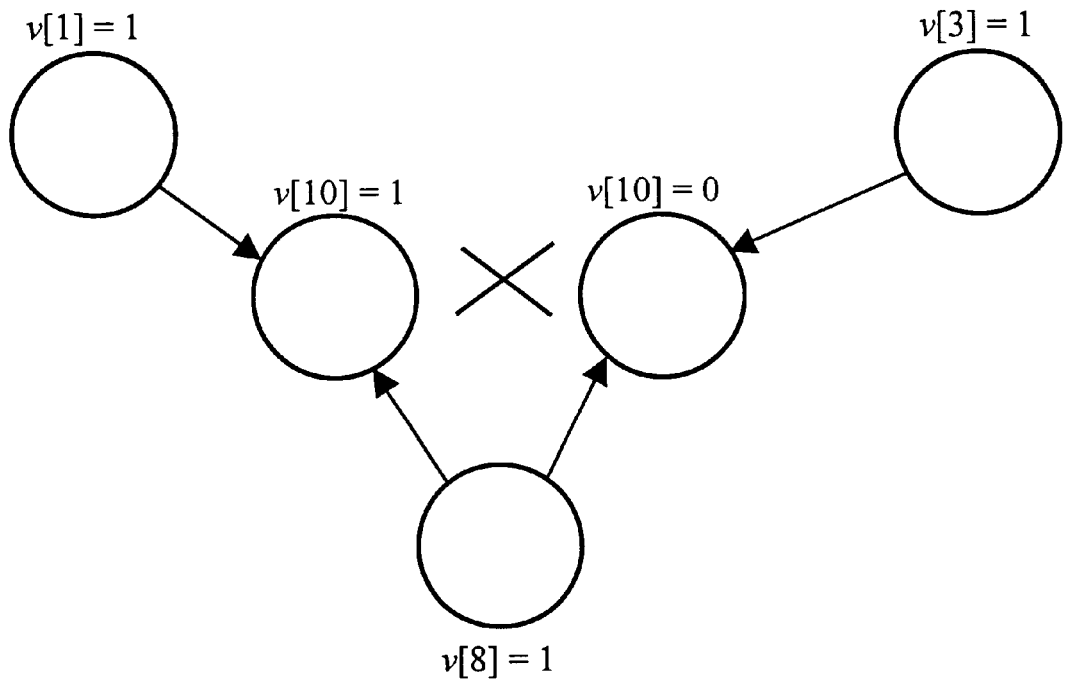
FIG. 3A depicts an implication graph illustrating a conflict after variable assignment.
Figure 3B:
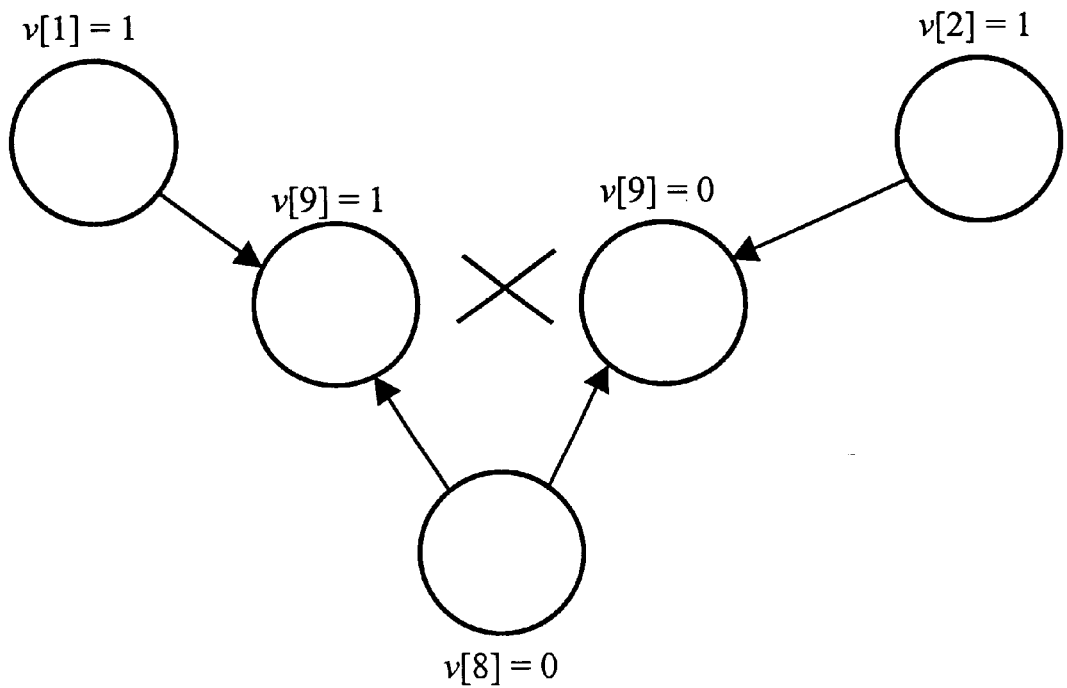
FIG. 3B depicts an implication graph illustrating a conflict after an altered variable assignment.

A detailed description of the preferred embodiments of the invention will now be given referring to the accompanying drawings.

In the design flows for previous architectures, all the four steps of synthesis, mapping, place-and-route and bit stream generation are required for each SAT formula implemented in reconfigurable hardware, i.e., FPGAs. Through the present invention, the amount of regularity and number of repetitive structures is maximized, and the regularity is taken advantage of with a compilation flow that results in an architecture that is that is orders of magnitude faster than previous architectures.

The modularity in the present invention arises from the fact that the SAT solver circuit is clause-based. The subcircuit for each clause encapsulates the variable implications arising out of the clause. The subcircuits for any two n-literal clauses are identical except for the input and output connections. In particular, the implication subcircuit for a general 3-literal clause $v_i + v_j + v_k$ would be:

$$v_i' \cdot v_j' \rightarrow v_k;\ v_j' \cdot v_k' \rightarrow v_i;\ v_i' \cdot v_k' \rightarrow v_j \qquad \text{Equation (2)}$$

Here $v_i', v_j', v_k'$ are the inputs and $v_i, v_j, v_k$ are implied outputs. Only one module needs to be designed for clauses with the same number of literals. These modules can be compiled once and be placed at different locations in the FPGA. The final subcircuit for each clause is then determined by the identity of the input and output wires.

Modular mapping of clause subcircuits itself is not enough for fast compilation. The routing of the signals is also important. For example, if the fixed clause modules with direct wire connections are used, the resulting circuit is still difficult to place and route. A more regular structure for the data communication is necessary. Ideally, it should be a fixed structure, such as a bus. At the same time, it should also support the bandwidth for propagating implied values.

While a bus or a crossbar can provide regular communication, a typical bus can have only one transaction at a time. This limits the communication bandwidth. It is also difficult to efficiently connect multiple FPGAs to a single bus. A crossbar, on the other hand, can provide any point-to-point communication with high bandwidth. However, due to the large number of clauses and variables, a fixed crossbar will take too many wires and is not feasible in practice for the number of connections required.

By studying the communication requirements of the SAT problem, the present invention utilizes a ring topology pipeline bus structure in which each time slot is associated with a fixed set of variables. Interestingly, the data communication requirement of the SAT problem differs from general parallel processing in that the messages are essentially for updating variables with their new values. The number of variables is relatively small—in the range of several hundred. A fixed timing sequence to send the values of all the variables around the circuit simplifies the communication control.

The advantages of an embodiment of the present invention will now be described generally. In an apparatus embodiment of the present invention, the pipeline bus spans multiple FPGAs and forms a ring. D-type flip-flops are placed on the bus to implement the pipelining of data. Each FPGA represents one stage on the pipeline bus. In each FPGA, the values on the pipeline bus can be monitored or modified by the clause subcircuits in each stage. There is no typical bus transaction protocol involved. The data bits propagate on the pipeline bus in fixed sequence and the identity of the variable is determined by a simple counter and comparator.

For example, assume there are 160 variables in the SAT formula and the width of the bus is 32 bits. The literals of the variables are indexed as $v_0, v_0', \ldots v_{159}, v_{159}'$. The literals of 16 variables occupy 32 wires at one stage. The wires are $w_0 \ldots w_{31}$. If at clock $t_0$, $v_0, v_0' \ldots v_{15}, v_{15}'$ are at the same stage, at clock $t_0+1$, $v_{16}, v_{16}' \ldots v_{31}, v_{31}'$ are pipelined to this stage while the group of $v_0, v_0' \ldots v_{15}, V_{15}'$ have propagated to the next stage. At each pipeline stage, the variables pass in the predetermined order. The benefit of this scheme is that there is no need to send the identity of the variables because they are identified by their position in the sequence. This ensures a high throughput for the value propagation and the implementation is simple. The identification can be carried out by comparing the sequence counter to a stored value.

Figure 4:
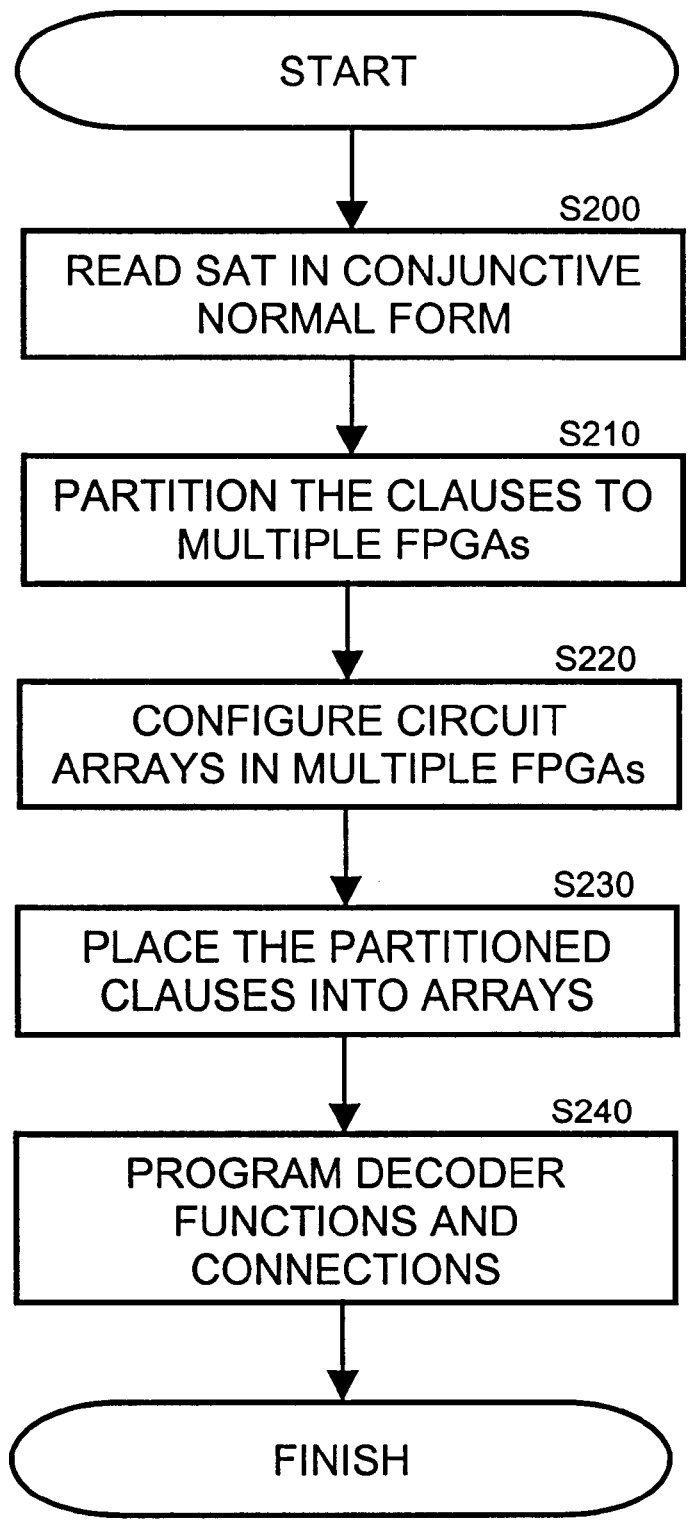
FIG. 4 depicts the process flow for creating a Boolean SAT solver.

The method of the present invention will now be described in summary fashion, with reference to FIG. 4. As described above, the method uses a Boolean SAT solver apparatus for solving a Boolean SAT formula, and the Boolean SAT solver includes a plurality of reconfigurable hardware modules. In FIG. 4, at Step S200, the Boolean SAT formula is read. Next, at Step S210, the method partitions the Boolean SAT formula and limits each partition to a predetermined number of variables in each clause. At Step S220, the method configures the internal circuitry of plurality of reconfigurable modules into circuit arrays. Following this step, at Step S230, the method assigns the Boolean SAT formula partitions to the circuit arrays in the plurality of reconfigurable hardware modules. Finally, at Step S240, the method programs the functions and connections specific to each partition of the Boolean SAT formula within the circuit arrays of each of the plurality of reconfigurable hardware modules.

Each step of the method of the present invention described above will now be described in greater detail.

As shown in FIG. 4, at Step S200, the Boolean SAT formula is read at Step S200. The Boolean SAT formula is represented in the conjunctive normal form.

As described above, at Step S210, the method next partitions the Boolean SAT formula and limits each partition to a predetermined number of variables in each clause. Each partition of the Boolean SAT formula is partitioned into a conjunctive normal form representation. In the preferred embodiment, each clause will be limited to three variables. Each Boolean SAT formula can be transformed to 3-clauses in polynomial time by introducing new variables. Limiting the Boolean SAT formula to a predetermined number of variables in each clause allows the present invention to use a single type of clause module for all the clauses instead of clause modules of many different sizes.

The configuring of the internal circuitry of the plurality of reconfigurable modules into circuit arrays will now be described in greater detail. The method creates a basic template for the partitioned 3-clauses for use in the FPGAs. The first step entails designing a single clause module by schematic design. This technique gives simple correspondence between the design and implementation. This design is used as the origin. For the preferred embodiment, the XILINX Foundation implementation tool is used to place and route the design into the FPGA.

The next step entails reshaping the clause module. The compiled clause module is placed on the whole FPGA. It is desirable that the complied clause module is in a regular shape so that many modules can be tiled into one FPGA. The CLBs are rearranged to create a rectangular module for a clause. In the preferred embodiment, the EPIC tool provides a graphical user interface to edit the actual layout of the FPGA.

Figure 6:
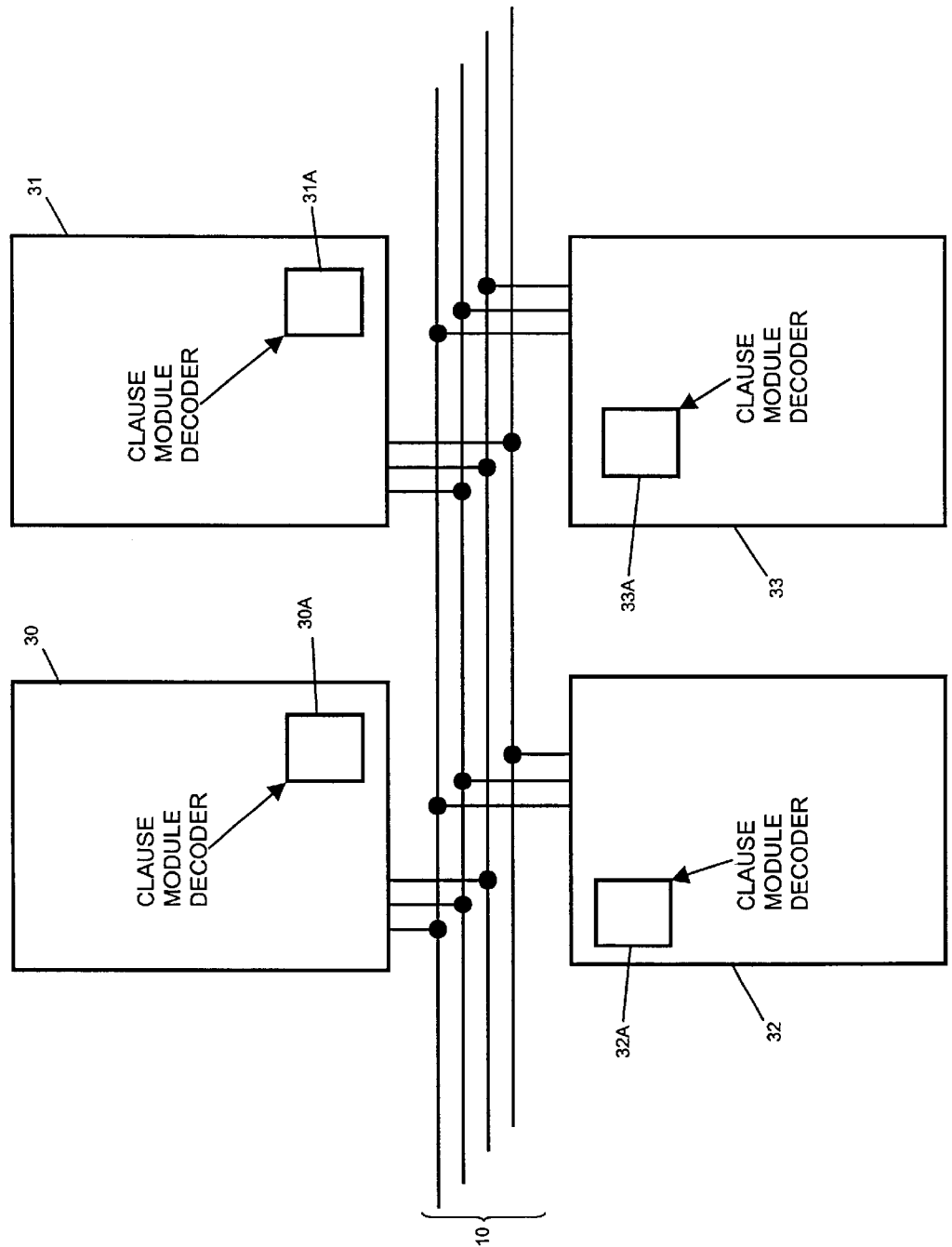
FIG. 6 illustrates an embodiment of the present invention with the FPGAs connected to the pipeline bus and illustrating the clause module decoders within each FPGA.

Finally, the SAT template is created. The complied clause module is duplicated in the FPGA and global routing is added to the circuit. This provides a generic template for the SAT solver implementation. The clause modules and major routing are defined in the template. The decoder and interconnects between clause modules and pipeline bus are programmed according to the individual clauses. The generic template should be further customized according to the Boolean SAT formula. Two entities must be customized within each clause module: (1) the comparator to identify the variable on the pipeline bus, and (2) the connection to the pipeline bus. Referring to FIG. 6, the FPGAs 30–33 are connected to the pipeline bus 10. Within each FPGA 30–33, there is a clause module decoder 30A–33A for each clause that is implemented on the individual FPGA. The clause module decoder indicates to the clause module when variables that are implemented by the clause module are present on the pipeline bus 10.

Following this step, at Step S230, the method assigns the Boolean SAT formula partitions to the circuit arrays in the plurality of reconfigurable hardware modules. Standard techniques, known in the art for assigning formula partitions to circuit arrays within a reconfigurable hardware module, are used.

Finally, at Step S240, the method programs the functions and connections specific to each partition of the Boolean SAT formula within the circuit arrays of each of the plurality of reconfigurable hardware modules. Again, standard techniques as is known in the art for programming the functions and connections specific to each formula partition within a reconfigurable hardware module are used.

A second embodiment of the present invention is an apparatus for downloading a Boolean SAT solver algorithm and formula, and for solving the corresponding Boolean SAT problem. The apparatus of the third embodiment will be described in summary fashion. The first element of the apparatus is a clause module. As described earlier, the clause module implements the Boolean SAT solver algorithm. An implementation of the Boolean SAT solver will contain as many clause modules as necessary to accommodate the Boolean SAT formula. The second element of the apparatus is a control device for receiving the Boolean SAT solver algorithm and Boolean SAT formula and distributing the Boolean SAT solver algorithm and formula to the clause module or clause modules. The third element of the apparatus is a pipeline bus interconnecting the control device and the clause module or clause modules in a ring topology. This configuration, allows the Boolean SAT solver algorithm, formula and variable values to be passed between the control device and the clause modules.

The final element of the apparatus is a host computer for downloading the Boolean SAT solver algorithm and formula to the control device and receiving results therefrom.

Figure 5:
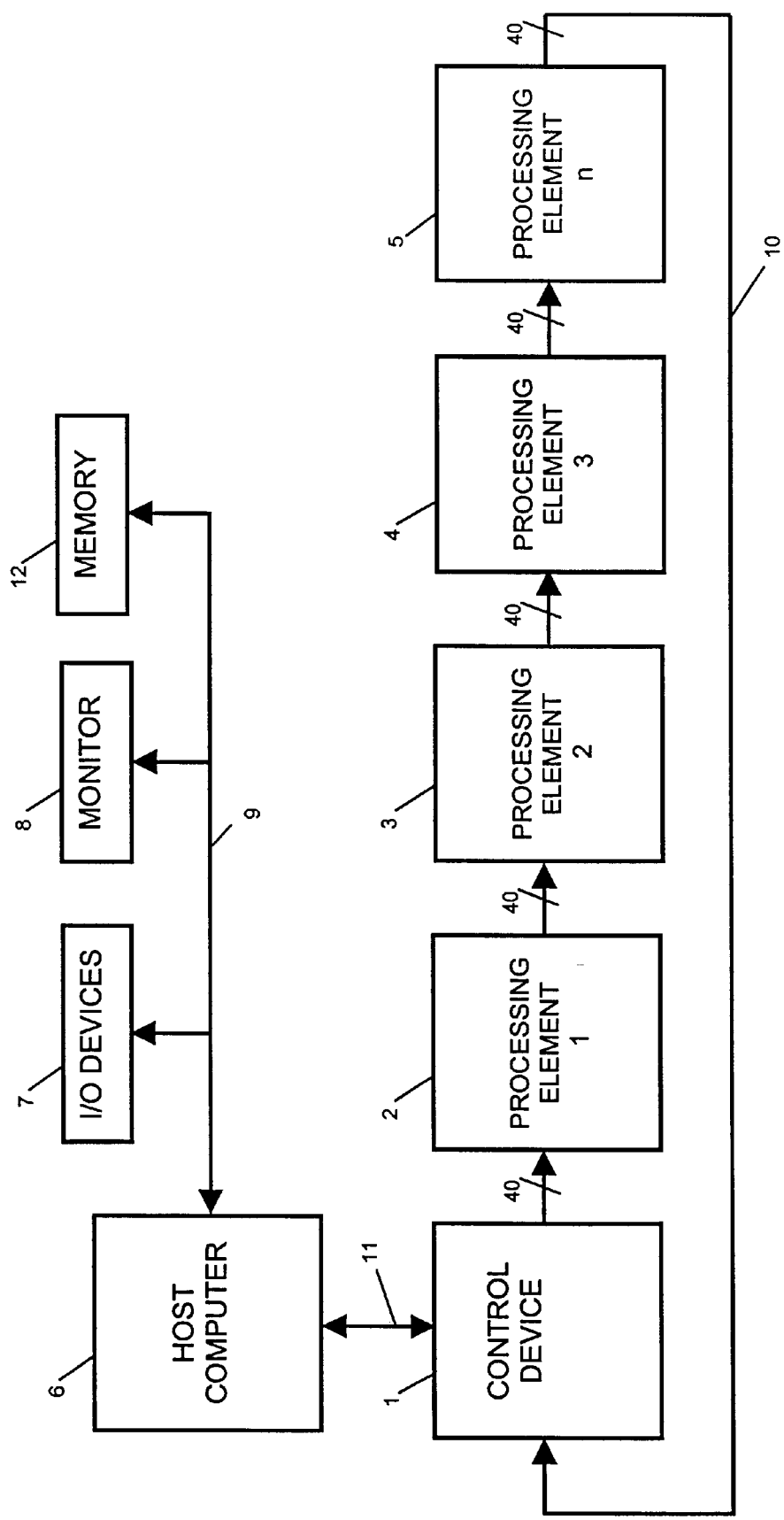
FIG. 5 illustrates a first embodiment of the present invention.

The second embodiment of the present invention will now be described in greater detail. The circuit topology is based on a regular ring structure as shown in FIG. 5. There is a control device 1 and a series of processing elements (PEs) 2–5 on the ring. Each PE is one FPGA containing at least one clause module. A pipeline bus 10 goes across the ring. Each PE represents one stage on the pipeline bus 10, so a wire will cross no more than one FPGA boundary. The size of the ring is determined by the size of the SAT formula. More clauses require more clause modules, hence more FPGAs.

The pipeline bus 10 is used to send the updated variables and some control signals to all the processing elements 2–5. The width of the pipeline bus 10 depends on the available I/O pins of the FPGA chip. Referring to FIG. 5, if the pipeline bus 10 is 40 bits wide, the FPGA chip will use 40 I/O pins for the incoming signals and another 40 pins for the output to the next FPGA. The 40-bit bus consists of 32 data wires and 8 control bits. It will pass 16 variables in each clock cycle. Signals are pipelined through a series of D-flip flops. All the variable data bits pass through the pipeline bus 10 in a fixed order, with a synchronizing signal at the beginning.

Within each FPGA, the clause modules have access to the values on the bus. They can also update the value on the bus. For example, if a new implication is made, it will set the corresponding bit to 1. The newly updated literal will pass around the ring, so every clause will be able to see the update in a few cycles.

The ring structure also has the flexibility of extending the capacity by allowing the connection of a number of boards into one system. We can also divide a large system into several smaller SAT solvers. This flexibility of expanding capacity or dividing hardware into multiple problems improves the utilization and efficiency of the hardware.

The control device 1 will now be described in greater detail. The control device 1 maintains the global state and monitors the ring topology pipeline bus 10 for value changes and conflicts. Since the functions of the control device 1 are fixed, the control device 1 need only be compiled once. The control device 1 occupies one FPGA and is connected to both the pipeline bus 10 and a communication interface 11 to the host computer 6. The host computer 6 also includes I/O devices 7, a monitor 8, and memory 12. The I/O devices 7, monitor 8 and memory 12 are connected to the host computer 6 by a bus 9.

One function of the control device 1 is to manage the state transitions between the four main states of the SAT solver apparatus—branching, implication, analysis and backtrack. The control device 1 sets the control signals on the pipeline bus 10 to insure proper operations for the clause modules. The control device 1 should decide the state transition depending on the signals of conflict and value change. The control device 1 should send the control signals to the clause modules so they can perform the appropriate operation.

The control device 1 monitors value of the variables to identify conflict, and also monitors whether a new value has been generated. During the conflict analysis, the control device 1 records the variables identified as the predecessors for the conflict. This information is used to determine the backtrack destination and to construct the new addition clause.

If both literals of a variable are set to 1, a conflict arises and causes conflict analysis and backtrack. As conflict analysis is required, it is necessary to identify which variable has the conflict. Each pair of literals for one variable feed an AND gate to create a variable conflict signal. These conflict signals feed a wide OR gate for global conflict signal. The conflict signals also feed a priority encoder so the identity of the conflict variable can be stored. The control device 1 posts this variable on the pipeline bus 10 as the starting point for conflict analysis.

A branch decision is selecting a new value for an undetermined variable. The control device 1 should decide on the next available free variable. During implication, the control device 1 checks if both literals of a variable are 0. The control device 1 feeds a priority encoder, just like the one for the conflict check described above. Then, the variable selected will be assigned 1 through a decoder during the branching. After a branch decision is made, the control device 1 switches to into implication mode.

During the analysis to determine whether backtracking is indicated, the control device 1 waits until all values settle. The control device 1 collects the variable assignments leading to the conflict. The most recent assignment is the backtrack destination. The control device 1 will forward this set of variables to the host computer 6 if clause addition is required.

The control device 1 should be connected to the host computer 6 to send the termination signal and to shift the solution out. If clause addition is required because of the backtracking determination, the control device 1 will send out the additional information about the additional clause to the host computer. The control device 1 will coordinate the reconfiguration for additional clause modules.

The pipeline bus 10 will now be described in greater detail. First and foremost, the pipeline bus 10 allows the variable values to be passed between clause modules and between the control device 1 and the clause modules themselves in a time multiplexed manner. The pipeline bus 10 provides a multitude of functions in the Boolean SAT solver.

Figure 7:
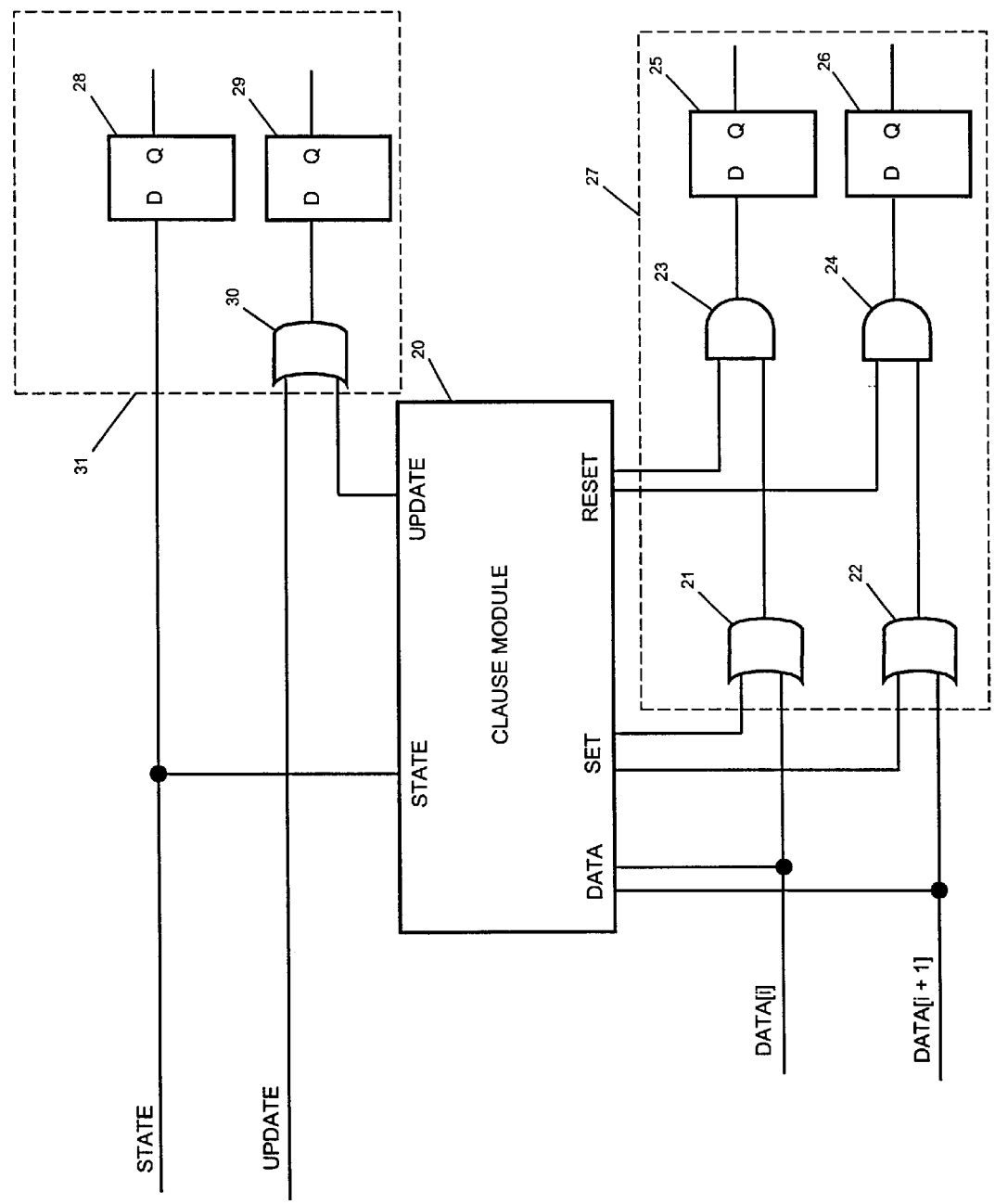
FIG. 7 illustrates an embodiment of the clause module of the present invention in greater detail.

Referring to FIG. 7, the pipeline data bus interface 27 will now be described in greater detail. The pipeline data bus interface 27 outputs the current state of the Boolean variables of the downloaded clause onto the pipeline bus 10. The pipeline data bus interface 27 comprises a decoder (not shown) to determine if the current clock cycle contains one or more variables present in the clause and identifies the Boolean variables that are present on the pipeline bus 10. The pipeline data bus interface 27 also comprises a first gate 21 having a gate output, wherein the inputs to the first gate 21 are connected to a data line of the pipeline bus 10 and the set signal output of the clause module 20. In the preferred embodiment, this first gate 21 is an OR-gate. This first gate is repeated for each data line. The pipeline data bus interface 27 also includes a second gate 23 having a gate output, wherein the inputs of the second gate 23 are connected to the reset signal output of the clause module 20 and the first gate 21 output. In the preferred embodiment, the second gate 23 is an AND-gate. Again, the second gate is repeated for each data line. Finally, the pipeline data bus interface 27 further comprises a data register 25 connected to the second gate output. Each data line of the pipeline bus has a data register assigned to it.

The pipeline signal bus interface 31 of the pipeline bus 10 will now be described in greater detail. The pipeline signal bus interface 31 signals if any of the Boolean variables of the downloaded clause have been updated, and places the updated variable on the pipeline bus 10. The pipeline signal bus interface 31 comprises a gate 30 having a gate output, wherein the inputs of the gate 30 are connected to an update line of the pipeline bus 10 and the update signal output from the clause module 20. In the preferred embodiment, the gate 30 is an OR-gate. The pipeline signal bus interface 31 further includes a data register 29 connected to the gate 30 output.

The structure of the clause module 20 will now be described in greater detail. The clause module 20 computes implications and performs conflict analysis on Boolean variables comprising the downloaded clause. The clause module 20 performs the computing task of a clause in the SAT formula. It computes implications and performs conflict analysis. Since the clause module 20 is connected to the pipeline bus 10, it also includes the interface to the pipeline bus 10. FIG. 7 shows one clause module 20 in the context of one pipeline stage. The clause module 20 sets or resets the values on the pipeline bus 10 during implication or analysis. Referring to FIG. 7, each clause module 20 comprises a data signal input, a set signal output, a reset signal output, a state signal input and an update signal output.

The pipeline bus 10 circulates the variable values in fixed sequence. The clause module 20 identifies the variables on the pipeline bus 10, and in this embodiment, this is implemented with a counter and a comparator. The counter can be shared between multiple clauses within the same pipeline stage. Since every FPGA represents one stage of the pipeline, all the clauses on one chip can share the same counter. The counter is reset to 0 at the beginning of the sequence of variables. It increases by 1 in each clock cycle. The number of bits for the counter depends on the width of the pipeline bus 10 and the number of variables. The counter is compared to a pre-stored value to determine if a particular variable is on the pipeline stage.

In this embodiment, since the number is compared to a constant, there is no need for a full comparator. The clause module 20 just requires a combinational gate that outputs one only for a given input vector. In this embodiment, a CLB can take up to nine inputs. Using one input as a flag, a CLB can serve as a constant checker of up to 256 pipeline stages. If one stage can handle 16 variables, a SAT formula with up to 4096 variables need use a comparator made of only one CLB and an 8-bit counter.

Within each stage, there are a number of variable wires. The clause module 20 should connect to the proper wires for its variable. For example, assuming 32 data wires, literal v is located at stage i/16, wire (imod16)*2, while v' is located at the same stage and wire (imod16)*2+1. With the identification performed by the counter and checker, the pipeline data bus interface 27 should take care of updating values both from the pipeline bus 10 to the clause module 20 and from the clause module 20 to the pipeline bus 10. This task is handled by a set of registers and some control circuits (not shown). Each clause module 20 has a set of local registers to store the values of the relevant variables. They are updated from the pipeline bus 10 once the variable is available. It also has a set of registers to store the values it wants to put on the pipeline bus 10. When the variable is accessible, the value is updated. It also sets the update signal, telling the control device 1 that new values have been asserted.

When the clause module 20 is performing an implication, it checks the local variable registers and generates new implications accordingly. The new implications will subsequently update the variable values circulating on the pipeline bus 10. The clause module 20 also remembers that such an implication has been made, and uses this information in the analysis process.

The analysis process performed by the clause module 20 is a reversal of the implication process. The clause module 20 determines the predecessors of a conflict. The clause module 20 starts by setting both literals of the conflict variable to 1. If a clause has generated an implication, the clause module 20 checks whether this implied literal is set to one on the pipeline bus 10. If so, it means the analysis process is looking for the predecessors of this literal. The clause module 20 then sets the complement of the other literals in the clause to 1 because these values have led to the implication. The implied literal is reset to 0 on the pipeline bus 10 because this literal has already been accounted for. This process ends when all the true values on the pipeline bus 10 are determined by branch decisions. At this moment, the control device 1 should generate the predecessor set and decide the backtrack destination.

Figure 8A:
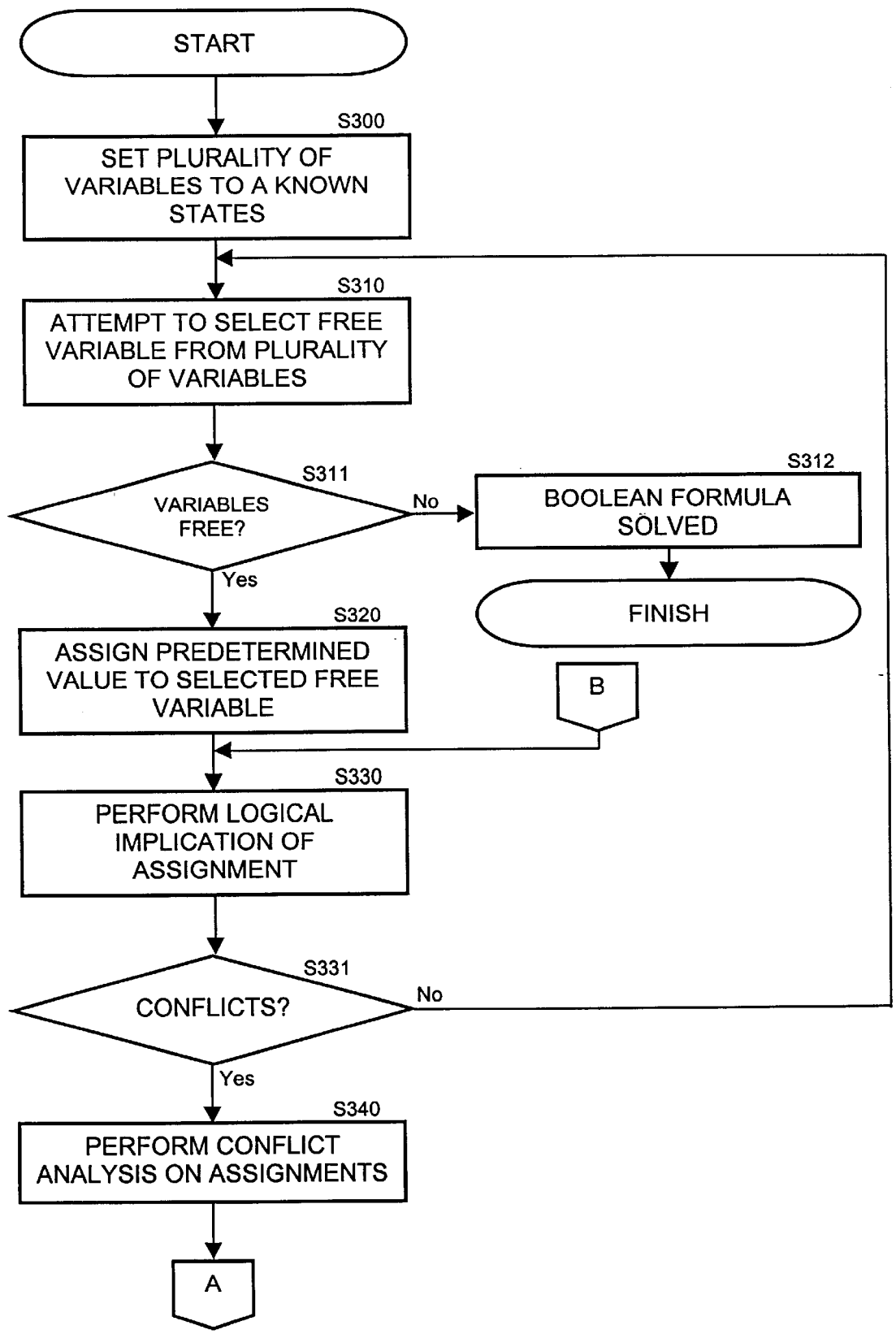
FIGS. 8A–8B depict the process flow of a method for solving a Boolean SAT formula.
Figure 8B:
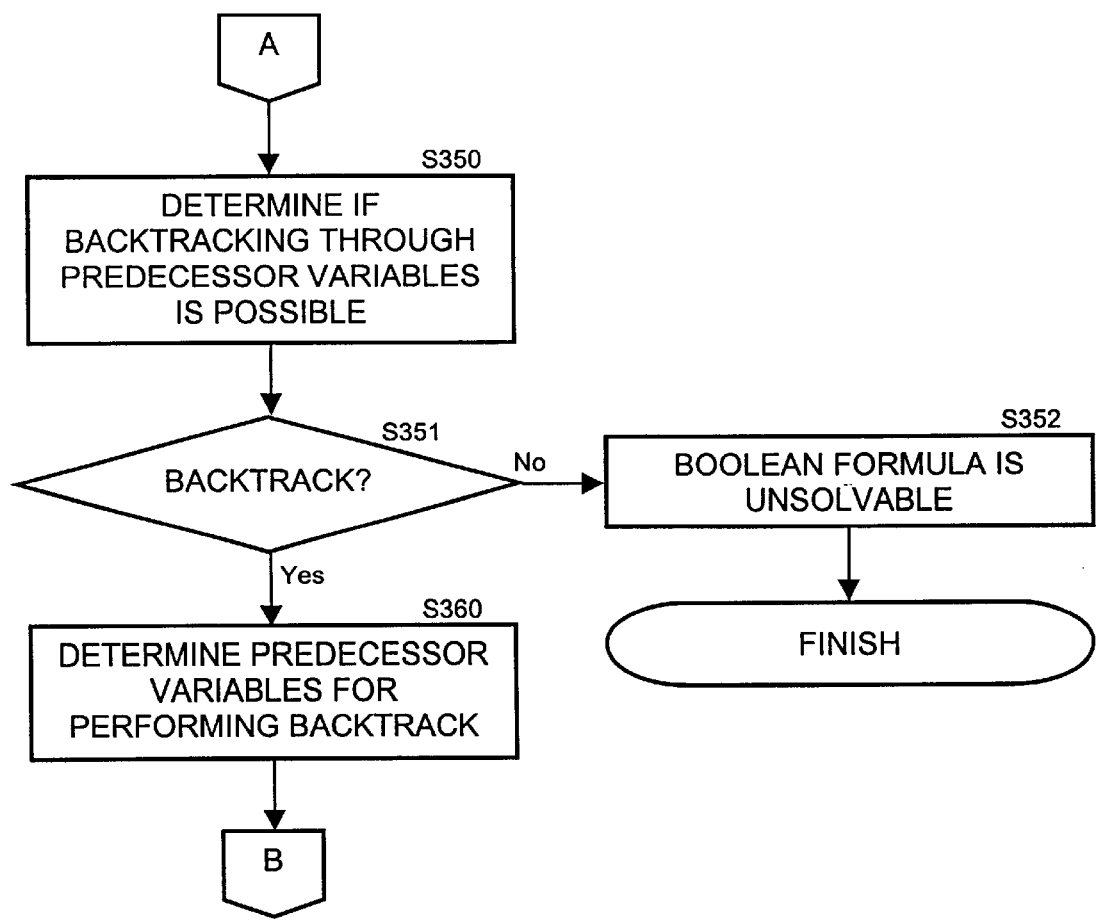

A third embodiment of the present invention is embodied in a method for solving a Boolean SAT formula containing a plurality of Boolean variables. Referring to FIGS. 8A–8B, at Step S300, the present invention sets the plurality of Boolean variables of the Boolean SAT formula to a known state. As described above, the Boolean variables are set to zero.

Next, at Steps S310–S312, a free variable is selected from the plurality of Boolean variables. A free variable is a variable that has not yet been assigned a value. If no more Boolean variables are available to be assigned, then the present invention indicates that all the variables have been assigned and the Boolean SAT formula solved.

At Step S320, the present invention assigns a predetermined value to the newly-selected free variable. The assignment sets the selected variable to one.

Next, at Steps S330–S331, the logical implication of the assignment to the free variable is computed. If the logical implication analysis indicates a conflict is present, then the present invention will perform conflict analysis on the Boolean variables and their assignments. If the logical implication of the assignment does not indicate any conflict among the variables, then the next step selects the next available free variable from the plurality of Boolean variables.

If so indicated by Step S331, at Step S340, conflict analysis is performed on the conflicts that arise from the logical implication of the free variable. The conflict analysis identifies the branching assignments that lead to the conflict. This is the reversal of the implication process. From the conflict variable, whose two literals are both either implied or assigned to 1, we need to find the transitive predecessors that have implied the values that led to the conflict. Adding this function requires additional hardware. When a clause generates an implication, this event should be remembered. In the analysis mode, this stored implication information is used to identify the predecessors.

For example, given the clause $(v_i+v_j+v_k)$, if $v_i=0$, $v_k=1$ is implied by the clause. In the analysis mode, $v_k=1$ on the bus means we are looking for the predecessors of $v_k$. The circuit of this clause should reset $v_k$ and set $v_i'$, and $v'_j$, because these two literals are the reason for the implication. The analysis may continue by identifying the predecessors to $v_i'$ and $v_j'$.

If the true literals are assigned due to implication, their predecessors will be posted on the bus while they are reset to false. If a literal is assigned due to branching, it has no predecessors. It will keep circulating the bus. This analysis process ends when no value change occurs to the literals on the bus. At this moment, only the predecessors assigned by branching are circulating with value one. Collecting these values creates the set of assignments that leads to the conflict.

The result of the conflict analysis of Step 340 are used by the present invention to backtrack through the Boolean SAT formula. The backtrack process will determine if backtracking through the predecessor variables that obtained their value from the assigned free variable and restarting the logical implication is warranted. The backtracking determination will also indicate that the Boolean SAT formula is unsolvable and backtracking through the predecessor variables is unnecessary.

With the list of the predecessors, the backtracking target is the most recent assignment within this list. It often backtracks more levels than it would with the basic backtracking algorithm, which backtracks to the most recent assignment.

An additional step in the method is dynamic clause addition into the Boolean SAT formula. As a result of the conflict analysis, redundant clauses can be added which do not affect the final result, but potentially speed up the algorithm. For example, if both assignments $v_m=0$ and $v_m=1$ lead to conflict, the analysis will generate two sets leading to the conflicts. Assume they are $v_i, v_j, v_m$ and $v_k, v_l, v_m'$. After the two conflicts, we can add a new clause (v'i+v'j+v'k+vk) and backtrack to the most recent assignment among these four variables. The new clause is redundant because it is drawn on other clauses. However, it makes hidden constraints explicit. It will help prune the future search spaces.

Figure 9:
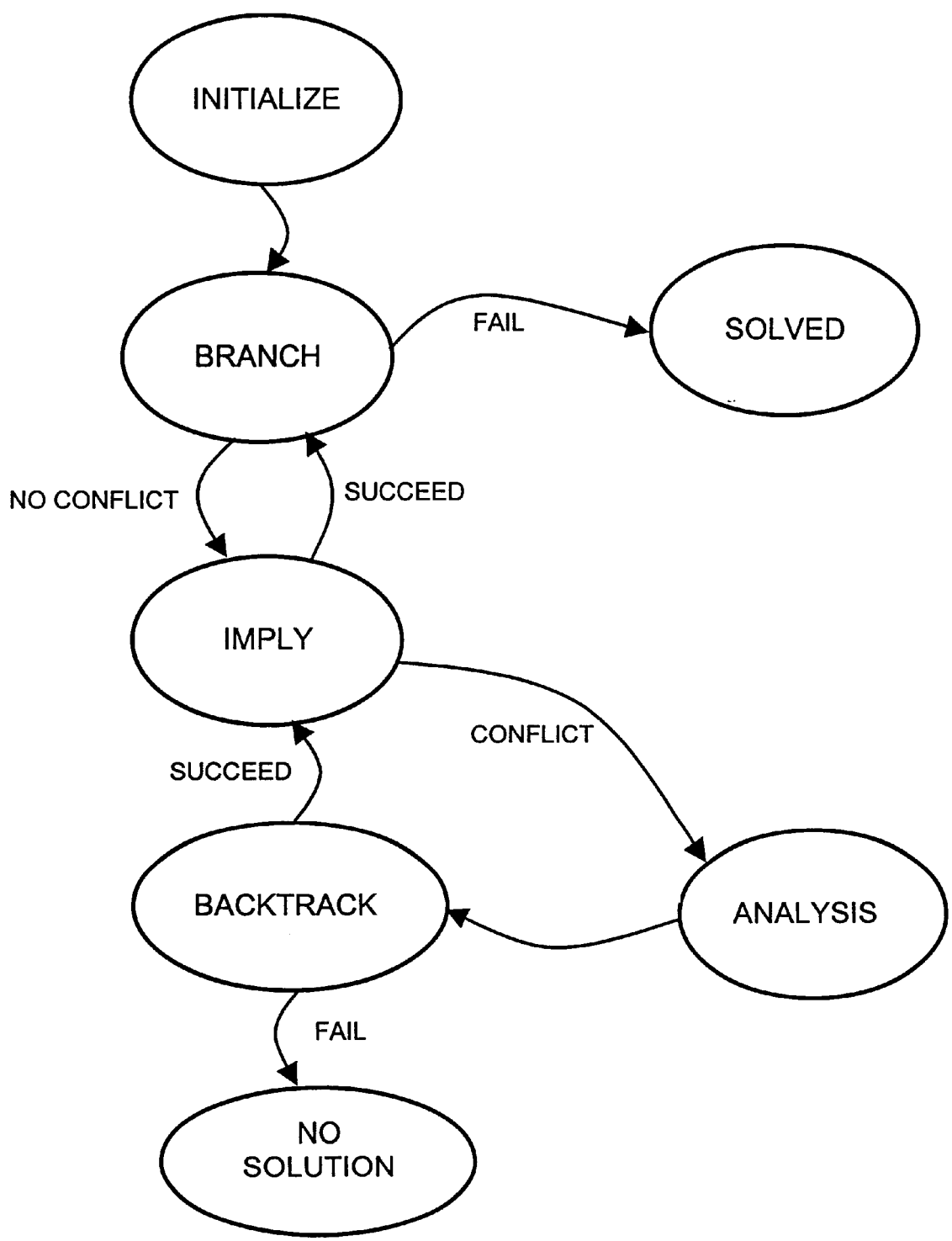
FIG. 9 depicts a state diagram of a method for solving a Boolean SAT formula.

For clarity's sake, FIG. 9 has been included to illustrate the process of the third embodiment of the present invention. The various states that the method of the third embodiment will progress through are shown.

A fourth embodiment of the present invention is a method of solving a Boolean SAT formula containing a plurality of Boolean variables using a solver apparatus. The solver apparatus comprises a plurality of processing elements, a control device, a pipeline bus interconnecting the plurality of processing elements and the control device in a ring topology, and a host computer interconnected to the control device.

Figure 10A:
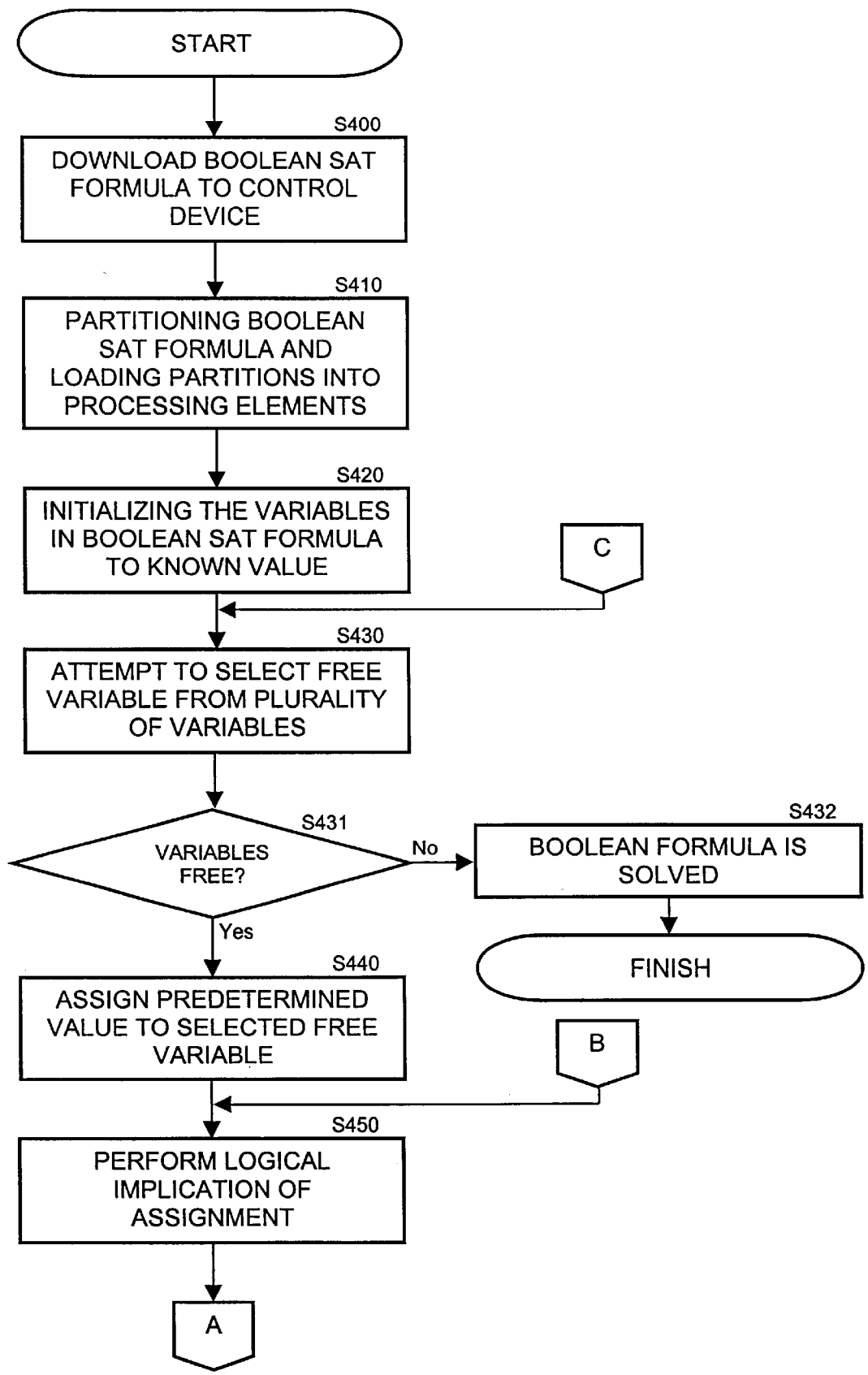
FIGS. 10A–10B depict a process flow for downloading and solving a Boolean SAT formula using a Boolean SAT solver apparatus.
Figure 10B:
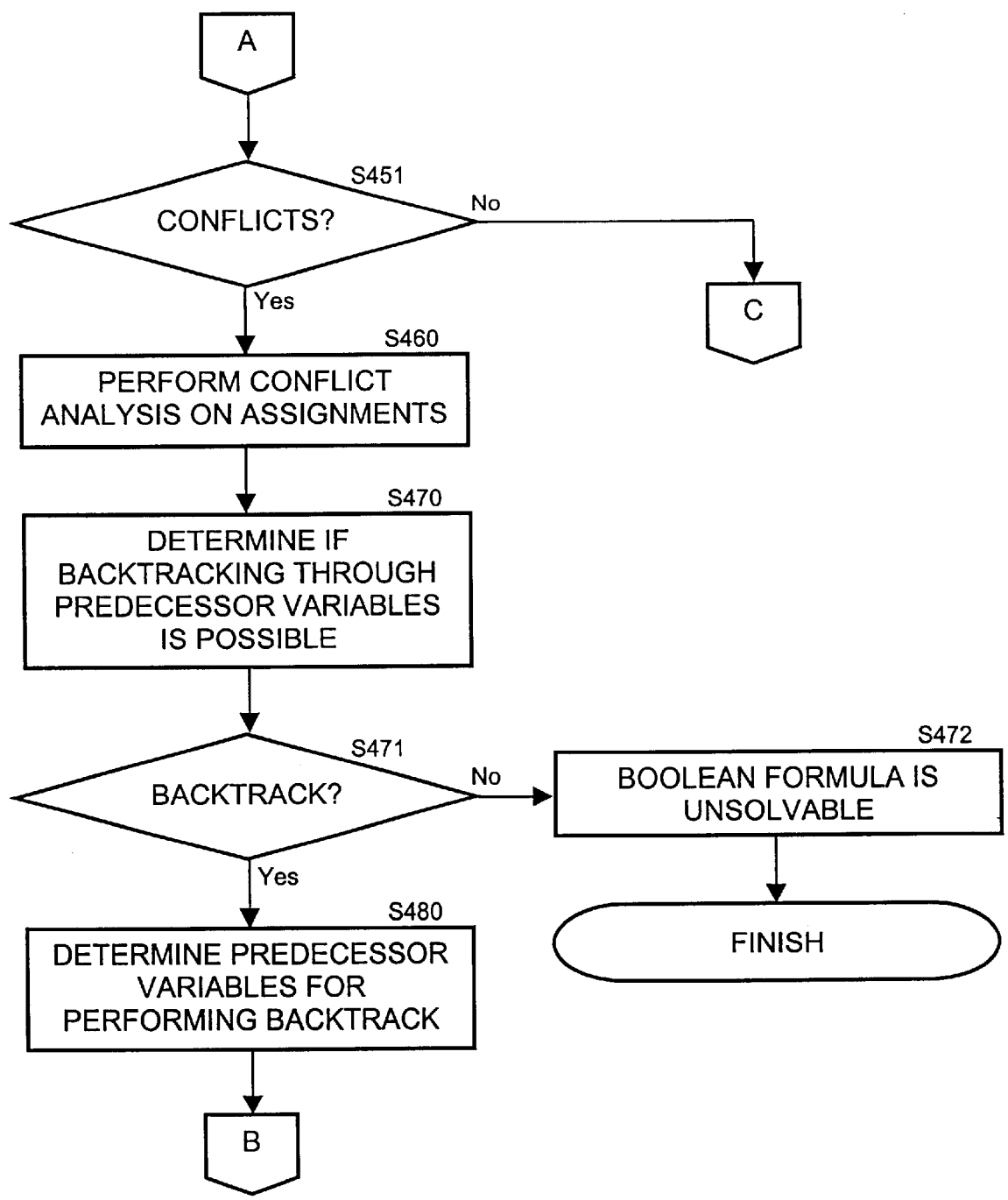

Referring to FIGS. 10A–10B, at Step S400, the host computer has received the Boolean SAT formula. The Boolean SAT formula is downloaded to the control device over an electronic link between the two devices.

Next, at Step S410, the control device partitions the downloaded Boolean SAT formula and loads the partitions onto the plurality of processing elements. The partitioning of the Boolean SAT formula is performed as described above.

At Step S420, the control device initializes the plurality of variables of the Boolean SAT formula to a known value. Each of the variables that will be on the pipeline bus is initialized.

At Steps S430–S432, the control device attempts to select a free variable from the plurality of Boolean variables. If the selection process is successful, a predetermined value is assigned to the selected Boolean variable at Step S440. If the attempt to select a free variable from the plurality of Boolean variables is not successful, then the control device indicates that the Boolean SAT formula has been solved.

Next, at Steps S450–S451, the control device computes the logical implication of the assignment to the free variable. If the logical implication does not raise any conflicts, then the control device selects another free variable from the plurality of Boolean variables and the process begins again. If a conflict is uncovered, conflict analysis on the free variable is performed.

At Step S460, the control device performs conflict analysis on the results of the logical implication. Conflict analysis on the variables is performed as described above.

At Steps S470–S472, the control device determines whether to backtrack through the predecessor variables that obtained their value from the assigned free variable. If the control device determines that backtracking is necessary, the backtracking is performed through the predecessor variables and the logical implication is restarted, as shown in Step S480. Otherwise, the control device indicates that the Boolean SAT formula is unsolvable.

As used herein, the term "computer system" is to be understood to include at least a memory and a processor. In general, the memory will store, at one time or another, at least portions of an executable program code, and the processor will execute one or more of the instructions included in that executable program code. It will be appreciated that the term "executable program code" and the term "software" mean substantially the same thing for the purposes of this description. It is not necessary to the practice of this invention that the memory and the processor be physically located in the same place. That is to say, it is foreseen that the processor and the memory might be in different physical pieces of equipment or even in geographically distinct locations.

Referring to FIG. 5, the invention is embodied by a computer system adapted for solving Boolean SAT formulas that includes a host computer 6, I/O devices 7, and a video display terminal 8. The computer system further includes a memory 12 including software instructions adapted to enable the computer system to perform the steps of the invention of solving a Boolean SAT formula containing a plurality of Boolean variables. A data bus 9 connects the I/O devices 7, the video display terminal 8 and the memory 12 to each other and to the host computer 6.

The software instructions are adapted to enable the computer system to set the plurality of Boolean variables of the Boolean SAT formula to a known state. As described above, the Boolean variables are set to zero.

The software instructions on the computer system next select a free variable is selected from the plurality of Boolean variables. A free variable is a variable that has not yet been assigned a value. If no more Boolean variables are available to be assigned, then the computer system indicates to the user that all the variables have been assigned and the Boolean SAT formula solved.

If a free variable was selected from the plurality of Boolean variables, then the computer system assigns a predetermined value to the newly-selected free variable. The assignment sets the selected variable to one.

Next, the computer system computes the logical implication of the assignment to the free variable. If the logical implication analysis indicates a conflict is present, then the computer system will perform conflict analysis on the Boolean variables and their assignments. If the logical implication of the assignment does not indicate any conflict among the variables, then the computer system selects the next available free variable from the plurality of Boolean variables.

If so indicated by the results of the logical implication, the computer system performs conflict analysis on the conflicts that arise from the logical implication of the free variable.

The computer system uses the results of the conflict analysis to backtrack through the Boolean SAT formula. The backtrack process will determine if backtracking through the predecessor variables that obtained their value from the assigned free variable and restarting the logical implication is warranted. The backtracking determination by the computer system will also indicate that the Boolean SAT formula is unsolvable and backtracking through the predecessor variables is unnecessary.

The term "computer program product" as used herein will now be explained. On a practical level, the software that enables the computer system to perform the operations, described further below in detail, may be supplied on any one of a variety of media. Furthermore, the actual implementation of the approach and operations of the invention are actually statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media," or "computer-readable media," as used here, may include a diskette, a tape, a compact disc, an integrated circuit, a ROM, a CD, a cartridge, a remote transmission via a communications circuit, or any other similar medium useable by computers. For example, to supply software for enabling a computer system to operate in accordance with the invention, the supplier might provide a diskette or might transmit the software in some form via satellite transmission, via a direct telephone link, or via the Internet. Thus, the term, "computer readable medium" is intended to include all of the foregoing and any other medium by which software may be provided to a computer.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and all equivalent ways in which software is associated with a computer usable medium.

For the sake of simplicity, therefore, the term "program product" is thus used to refer to a computer useable medium, as defined above, which bears in any form of software to enable a computer system to operate according to the above-identified invention.

The present invention is also embodied in a program product bearing software that enables a computer to perform the steps of the invention of solving a Boolean SAT formula containing a plurality of Boolean variables, according to the invention. The computer program product enables a computer system to perform the steps of the invention of solving a Boolean SAT formula containing a plurality of Boolean variables, wherein the software instructions enable the computer to perform the invention. A computer readable medium bears the software instructions.

The software instructions embodied on the computer program product are adapted to enable the computer system to set the plurality of Boolean variables of the Boolean SAT formula to a known state. As described above, the Boolean variables are set to zero initially by the software instructions.

The software instructions embodied on the computer program product allow the computer system to select a free variable from the plurality of Boolean variables. A free variable is a variable that has not yet been assigned a value. If no more Boolean variables are available to be assigned, then the software instructions on the computer program product allow the computer system to indicate to the user that all the variables have been assigned and the Boolean SAT formula solved.

If a free variable was selected from the plurality of Boolean variables, then the software instructions assigns a predetermined value to the newly selected free variable. The assignment sets the selected variable to one.

Next, the software instructions embodied on the computer program product enable the computer system to compute the logical implication of the assignment to the free variable. If the logical implication analysis indicates a conflict is present, then the software instructions will perform conflict analysis on the Boolean variables and their assignments. If the logical implication of the assignment does not indicate any conflict among the variables, then the software instructions command the computer system to select the next available free variable from the plurality of Boolean variables.

If so indicated by the results of the logical implication, the software instructions cause the computer system to perform conflict analysis on the conflicts that arise from the logical implication of the free variable.

The software instructions on the computer program product command the computer system to use the results of the conflict analysis to backtrack through the Boolean SAT formula. The backtrack process will determine if backtracking through the predecessor variables that obtained their value from the assigned free variable and restarting the logical implication is warranted. The backtracking determination by the computer program product will also indicate that the Boolean SAT formula is unsolvable and backtracking through the predecessor variables is unnecessary.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

Thus, while only certain embodiments of the invention have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein.

What is claimed is:

1. A method of creating a Boolean SAT solver apparatus for solving a Boolean SAT formula, the Boolean SAT solver apparatus comprising a plurality of reconfigurable hardware modules, wherein the method comprises:

reading the Boolean SAT formula;

partitioning the Boolean SAT formula and limiting each partition to a predetermined number of Boolean variables;

configuring the plurality of reconfigurable modules to form circuit arrays;

assigning the partitions of the Boolean SAT formula to the circuit arrays in each of the plurality of reconfigurable hardware modules; and programming the functions and connections specific to each partition of the Boolean SAT formula within each of the plurality of reconfigurable hardware modules.

2. The method as set forth in claim 1, wherein the Boolean SAT formula is represented in conjunctive normal form.

3. The method as set forth in claim 2, wherein each partition of the SAT formula is a clause of the conjunctive normal form.

4. The method as claimed in claim 1, wherein the predetermined number of Boolean variables is less than or equal to three.

5. A method for solving a Boolean SAT formula containing a plurality of Boolean variables using a Boolean SAT solver comprised of a plurality of reconfigurable hardware modules, wherein the method comprises:

partitioning the Boolean SAT formula and limiting each partition to a predetermined number of Boolean variables;

setting the plurality of Boolean variables to a known state;

selecting a free variable from the plurality of Boolean variables and assigning a known value to the selected free variable or indicating that all the variables have been assigned and the Boolean SAT formula solved, dependent upon the outcome of selecting a free variable;

assigning a predetermined value to the free variable;

computing a logical implication of the assignment to the free variable and either performing conflict analysis on the free variable or selecting another free variable from the plurality of Boolean variables dependent upon the outcome of the computed logical implication;

performing conflict analysis on any conflicts that arise from the computed logical implication of the free variable; and determining whether to backtrack through the variables that obtained their value from the assigned free variable and backtracking through the variables and restarting the computation of the logical implication or indicating that the Boolean SAT formula is unsolvable, dependent upon the outcome of the backtrack determination.

6. The method as claimed in claim 5, wherein the predetermined number of Boolean variables is less than or equal to three.

7. A computer system adapted to solving a Boolean SAT formula containing a plurality of Boolean variables, comprising:

a processor;

a memory comprising software instructions, wherein the software instructions are adapted to enable the computer system to:

partition the Boolean SAT formula and limit each partition to a predetermined number of Boolean variables;

set the plurality of Boolean variables to a known state;

select a free variable from the plurality of Boolean variables and assign a known value to the selected free variable or indicate that all the variables have been assigned and the Boolean SAT formula solved, dependent upon the outcome of selecting a free variable;

assign a predetermined value to the free variable;

compute a logical implication of the assignment to the free variable and either perform conflict analysis on the free variable or select another free variable from the plurality of Boolean variables dependent upon the outcome of the computed logical implication;

perform conflict analysis on any conflicts that arise from the computed logical implication of the free variable; and determine whether to backtrack through the variables that obtained their value from the assigned free variable and backtrack through the variables and restart the computation of the logical implication or indicate that the Boolean SAT formula is unsolvable, dependent upon the outcome of the backtrack determination.

8. The computer system as claimed in claim 7, wherein the predetermined number of Boolean variables is less than or equal to three.

9. A computer program product for enabling a computer to solve a Boolean SAT formula containing a plurality of Boolean variables, comprising:

software instructions for enabling the computer to perform predetermined operations, and a computer readable medium bearing the software instructions;

wherein the predetermined operations comprise:

partitioning the Boolean SAT formula and limiting each partition to a predetermined number of Boolean variables;

setting the plurality of Boolean variables to a known state;

selecting a free variable from the plurality of Boolean variables and assigning a known value to the selected free variable or indicating that all the variables have been assigned and the Boolean SAT formula solved, dependent upon the outcome of selecting a free variable;

assigning a predetermined value to the free variable;

computing a logical implication of the assignment to the free variable and either performing conflict analysis on the free variable or selecting another free variable from the plurality of Boolean variables dependent upon the outcome of the computed logical implication;

performing conflict analysis on any conflicts that arise from the computed logical implication of the free variable; and determining whether to backtrack through the variables that obtained their value from the assigned free variable and backtracking through the variables and restarting the computation of the logical implication or indicating that the Boolean SAT formula is unsolvable, dependent upon the outcome of the backtrack determination.

10. The computer program product as claimed in claim 9, wherein the predetermined number of Boolean variables is less than or equal to three.

11. A method of solving a Boolean SAT formula containing a plurality of Boolean variables using a solver apparatus, wherein the solver apparatus comprises a plurality of processing elements, a control device, a pipeline bus interconnecting the plurality of processing elements and the control device in a ring, and a host computer interconnected to the control device, the method comprising:

downloading the Boolean SAT formula to the control device;

partitioning the Boolean SAT formula and limiting each partition to a predetermined number of Boolean variables, and loading the partitions into the plurality of processing elements;

initializing the plurality of variables of the Boolean SAT formula to a known value;

attempting to select a free variable from the plurality of Boolean variables and either assigning the free variable a known value or indicating that the Boolean SAT formula is solved, dependent upon the attempt to assign a known value to a free variable;

computing a logical implication of the assignment to the free variable and either performing conflict analysis on the free variable or selecting another free variable from the plurality of Boolean variables for assignment, dependent upon the outcome of the computed logical implication;

performing conflict analysis on any conflicts that arise from the computed logical implication of the free variable; and determining whether to backtrack through the variables that obtained their value from the assigned free variable and backtracking through the variables and restarting the computation of the logical implication or indicating that the Boolean SAT formula is unsolvable, dependent upon the outcome of the backtrack determination.

12. The method as claimed in claim 11, wherein the predetermined number of Boolean variables is less than or equal to three.

13. An apparatus for downloading a Boolean SAT the apparatus comprising:

at least one clause module that implements the Boolean SAT formula;

a control device that receives the Boolean SAT formula and distributing the Boolean SAT formula to the at least one clause module, where, prior to distribution, the Boolean SAT formula is partitioned into clauses and each clause is limited to a predetermined number of Boolean variables;

a pipeline bus interconnecting the control device and the at least one clause module in a ring topology, thereby allowing the partitioned Boolean SAT formula and variable values to be passed between the control device and the at least one clause module, and between clause modules; and a host computer for downloading the Boolean SAT formula to the control device and receiving results therefrom.

14. The apparatus as claimed in claim 13, wherein variable values are passed between clause modules and between the control device and the clause modules along the ring topology pipelined bus in a time multiplexed manner.

15. The apparatus as claimed in claim 15, wherein the clause module computes implications and performs conflict analysis on Boolean variables comprising the downloaded clause.

16. The apparatus as claimed in claim 13, further comprising a pipeline data bus interface for outputting the current state of the Boolean variables of the downloaded clause onto a pipeline data bus.

17. The apparatus as claimed in claim 16, the pipeline data bus interface further comprising:

a decoder to determine if a current clock cycle contains one or more variables present in the clause, and if so which variables;

a first gate having a first gate output, wherein inputs of the first gate are connected to a data line of the pipeline bus and a set signal output of the clause module; and a second gate having a second gate output, wherein inputs of the second gate are connected to a reset signal output of the clause module and the first gate output.

18. The apparatus as claimed in claim 17, wherein the pipeline data bus interface further comprises a data register connected to the second gate output.

19. The apparatus as claimed in claim 13, further comprising a pipeline signal bus interface for signaling if any of the Boolean variables of the downloaded clause have been updated.

20. The apparatus as claimed in claim 19, wherein the pipeline signal bus interface further comprises a third gate having a third gate output, wherein inputs of the third gate are connected to an update line of the pipeline bus and update signal output of the clause module.

21. The apparatus as claimed in claim 20, wherein the pipeline signal bus interface further comprises a data register connected to the third gate output.

22. The apparatus as claimed in claim 13, wherein the clause module further comprises:

a data signal input;

a set signal output;

a reset signal output;

a state signal input; and an update signal output.

23. The apparatus as claimed in claim 13, wherein the at least one clause module is a plurality of clause modules and the number of clause modules is equal to or greater than the number of clauses created by the partitioning of the Boolean SAT formula.

24. The apparatus as claimed in claim 13, wherein the predetermined number of Boolean variables is less than or equal to three.

* * * * *